PRODUCTION OF CIRCUITS

Filed July 28, 1965

Inventor:
Georg Lutz
By: Spencer & Kaye
Attorneys

United States Patent Office 3,468,018

Patented Sept. 23, 1969

3,468,018

PRODUCTION OF CIRCUITS

Georg Lutz, Nuremberg, Germany, assignor to Telefunken Patentverwertungsgesellschaft m.b.H., Ulm (Danube), Germany Filed July 28, 1965, Ser. No. 475,357

Claims priority, application Germany, Aug. 1, 1964, T 26,716

Int. Cl. B01j *17/00;* H05k *3/30*

U.S. Cl. 29—577 6 Claims

ABSTRACT OF THE DISCLOSURE

A method for joining microelectric components into microelectric circuit units by soldering. According to the method, circuit units are prepared wherein conducting paths are provided on an insulated base and meet at a junction. The junction is then divided to separate the conducting paths and form contact surfaces. Thereafter, a component is located at the divided junction, the contact points of which coincide with the contact surfaces of the conducting paths. The component is then joined to the contact surfaces of the conducting paths by being glued or soldered into place.

The present invention relates to a method and an apparatus for joining electronic components having unilaterally provided contact points, e.g., planar transistors, to circuits having laminar conductive paths, and more particularly for soldering microelectric components onto microelectric circuit units.

When soldering electronic components onto surfaces, for example, transistors which are positioned on a strip as units and not disposed in a housing and are cut therefrom before soldering, difficulties are encountered due to the transistor contact points being separated by a small distance. Accordingly, the placing of the laminar conductive paths upon a base of insulating material must be done in an extremely accurate manner in order to insure ease in soldering of the transistor units and proper electrical connections.

An object of the present invention is to provide a method for incorporating electronic components into microelectric circuits in a simple and easy manner.

Another object is to provide an apparatus for aiding in carrying out this method.

The present invention overcomes these difficulties by first applying all conductive paths necessary for connecting the electronic component in such a manner that the paths meet in a junction; by subsequently dividing the junction, into such contact surfaces that, one of the contact points of the component contacts respectively one of the contact surfaces; and by thereafter soldering or gluing the electronic component thereto.

Additional objects and advantages of the present invention will become apparent upon consideration of the following description when taken in conjunction with the accompanying drawings in which.

Figure 1:
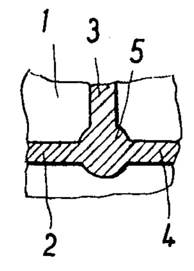
FIGURE 1 is a plan view of a conductive layer with non-separated junction applied to an insulating material, this layer having T-shape.

Referring now to the drawings, wherein like reference numerals are used throughout the several views, there is shown in FIGURE 1 a base 1 of insulating material, preferably of ceramic material which may function if desired as a component, e.g., as a dielectric or as a ferromagnetic component. The base 1 may also be made of resin-saturated paper, or of a plastic material, such as polypropylene, carbon polytetrafluoride, polyethylene, or an artificial resin.

Three conductive paths or sections 2, 3 and 4 are applied to the base 1, and combined in a junction 5. The conductive paths in the case of a ceramic base, can be of any conductive material such as baked-in silver platings which may be applied to the base by compressing, spraying, or vaporization, and which may be baked in addition, if desired. The conductive paths may also be applied in some other manner in accordance with methods known in connections with printed circuts. The paths may partially comprise resistive material and may be part of an electric circuit.

Figure 2:
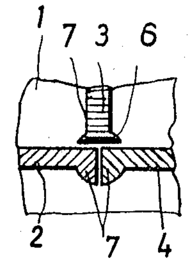
FIGURE 2 is a view similar to FIGURE 1 after the junction has been divided.
Figure 3:
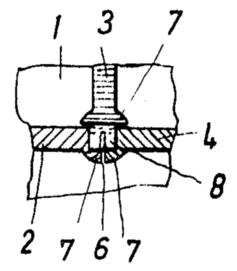
FIGURE 3 is a view similar to FIGURE 2 after the transistor has been soldered thereinto.

The junction 5, formed by the conductive paths, is then divided by separation lines 6 into contact surfaces 7, as shown in FIGURE 2. The separation lines 6 are preferably produced by grinding, but may be produced by any of the methods customarily employed in connection with printed circuit when forming the conductor networks, e.g., burning out or evaporating the material by means of an electron beam or by etching out the material. As shown in FIGURE 3, after the separation lines 6 have been produced, an electronic component such as a transistor element 8 is soldered thereto or is glued thereto by means of a conductive adhesive.

Figure 4:
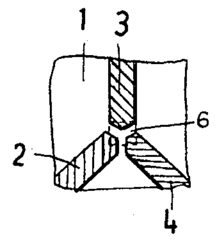
FIGURE 4 is a view showing one type of Y-shaped divided junction.
Figure 5:
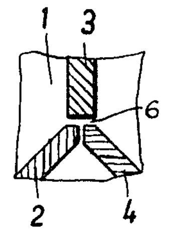
FIGURE 5 is a view showing a conductive layer applied in another type Y-shape having divided junctions.

FIGURES 4 and 5 illustrate Y-shaped conductors 2, 3, 4 whose junction is separated by Y or T-shaped separation lines 6.

The method of this invention is particularly applicable when using the screen printing technique for manufacturing circuit structures and entire circuits with passive circuit components, since when using this technique it is not possible to maintain the desired accurate, very small spacings. Thus, when the spacing is too small, the conductor adhesive used in soldering may form a conductive path across the separation and provide an improper electrical connection resulting in a short circuit; or the spacing may become too large so that the transistor soldered to the unit is not electrically contacted.

However, in accordance with this invention by subsequently applying the separation lines in a junction, it is possible to make the separation lines 6 so fine that the transistor unit to be soldered onto the system may even be displaced to a minor degree without endangering what would otherwise be flawless contacting.

It is to be noted that this invention is not limited to using three conductive paths combined into a junction. Rather, the invention may also be employed if, for example, in the case of diodes or capacitance diodes, only two connections are necessary, or in the case of pnpn transistors when four connections are required.

Figure 6:
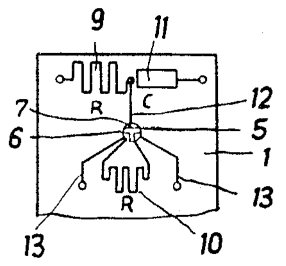
FIGURE 6 is a schematic plan view of a circuit with a junction according to the invention.

In FIGURE 6, a microelectric circuit system preferably applied by the screen printing technique is illustrated, comprising two resistors 9, 10 and a capacitor one of whose plates 11 is provided on the upper surface and whose counter-plate is provided on the opposite side of the base 1. Between resistor 9 and capacitor plate 11, a line 12 is provided leading to the junction 5 to which the resistor 10 as well as the leads 13 are also connected.

Again, three contact surfaces 7 are obtained by means of T-shaped separation lines 6, on which contact surfaces a transistor can be soldered or glued by means of a conductive adhesive.

Before or after separating the junction 5, the junction is preferably coated, at least in the region of the produced contact surfaces 7, with a solderable metal or with solder so that the electronic component to be soldered thereto may be applied by heating for a short time, without any further addition of solder, and without any additional soldering agents such as colophony.

Figure 7:
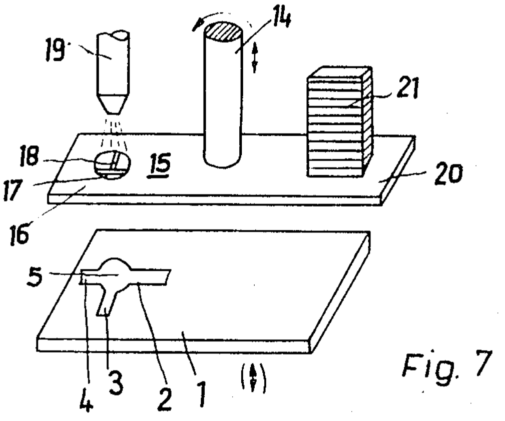
FIGURE 7 is a schematic perspective view of a device for applying the separating lines and for fastening the semiconductor elements.

In accordance with this invention, the separation of the junction 5 and the insertion of the semiconductor components 8 is carried out in one and the same device as shown in FIGURE 7. Here, the base 1 with the conductive paths 2, 3, 4 and the junction 5 is positioned beneath a plate 15 rotatably mounted on a shaft 14. One arm 16 of the plate 15 is provided with a recess, having a mask 17 inserted therein. The mask 17 is provided with cutout portion 18 corresponding to the separation lines 6 to be produced, and a sandblast device 19 is provided above the mask 17 for coacting with the mask to produce the separation lines.

The other arm 20 has a dispenser 21 and, if desired, a separator wherein the semiconductor elements 8 to be soldered are stacked. Mask 17 and dispenser or separator 21 are placed in such a manner that, after the plate 15 is rotated, the semiconductor element 8 to be soldered is brought to the exact desired position above the junction 5.

The plate 15 or the base 1, or both, are vertically adjustable in such a manner that they can be pressed against each other. In this contacting state, the separation lines 6 are produced by sand blasts, and then the plate 15 is rotated and again pressed against the base 1, whereby the semiconductor element 8 is soldered into the circuit.

It will be understood that the above description of the present invention is susceptible to various modifications, changes, and adaptations, and the same are intended to be comprehended within the meaning and range of equivalents of the appended claims.

What is claimed is:

1. A method for producing devices including microelectrical components mounted on microelectrical circuits having a plurality of unilateral conducting paths, said method comprising:

forming on a support member a conductive pattern comprising a plurality of discrete laminar conducting paths integrally joined at a junction portion;

dividing said junction portion into a plurality of separate electrical contact zones by removing intersecting narrow strip portions thereof, transverse to said paths by a device suitably provided therefor, whereby each of said zones is connected to a separate one of said plurality of conducting paths and is defined by thin separating lines in a desired geometrical design;

placing a mircoelectrical component on said junction portion in such a manner that each of said separate electrical contact zones in said junction portion contacts electrical contact points on said component, and the placing of said component on said junction portions is accomplished by said suitable device;

soldering the component to the separate contact zones by the use of said suitable device while pressing the component against said support member and the separate contact zones provided thereon.

2. The method as defined in claim 1 wherein the forming of said conductive paths is accomplished by a screen-printing technique.

3. The method as defined in claim 1 wherein the dividing of said junction portion is accomplished by grinding said separation lines.

4. The method as defined in claim 1 wherein the dividing of said junction portion is accomplished by etching said separation lines.

5. The method as defined in claim 1 wherein the dividing of said junction portion is accomplished by burning said separation lines.

6. The method as defined in claim 1 wherein the microelectronic components are semiconductor elements.

References Cited

UNITED STATES PATENTS

| | | | |
|---|---|---|---|
| 2,599,710 | 6/1952 | Hathaway | 29—625 |
| 3,061,911 | 11/1962 | Baker | 29—626 |
| 3,258,898 | 7/1966 | Garibotti | 29—577 |
| 3,284,878 | 11/1966 | Best | 29—620 |
| 3,289,046 | 11/1966 | Carr | 29—577 X |
| 3,292,240 | 12/1966 | McNutt et al. | 29—577 |

JOHN F. CAMPBELL, Primary Examiner

R. W. CHURCH, Assistant Examiner

U.S. Cl. X.R.

29—590, 626